United States Patent [19]
Kelly et al.

[11] Patent Number: 5,586,891
[45] Date of Patent: Dec. 24, 1996

[54] ELECTRICAL SOCKET FOR HIGH-FREQUENCY APPLICATIONS

[75] Inventors: David J. Kelly, Worchester; Gary P. Pirani, Shrewsbury; Alan M. Gulachenski, West Millbury; all of Mass.

[73] Assignee: Electronic Designs Inc., Westborough, Mass.

[21] Appl. No.: 237,676

[22] Filed: May 4, 1994

[51] Int. Cl.⁶ .................................................. H01R 9/09
[52] U.S. Cl. ................................................ 439/71; 439/70
[58] Field of Search ................................ 439/66, 91, 68, 439/70, 71

[56] References Cited

U.S. PATENT DOCUMENTS

| | | | |
|---|---|---|---|
| 4,278,311 | 7/1981 | Scheingold et al. | 439/71 OR |
| 4,473,798 | 9/1984 | Cedrone et al. | 324/158 |
| 4,491,378 | 1/1985 | Crawford | 439/71 X |
| 4,696,525 | 9/1987 | Coller et al. | 439/70 X |
| 4,746,299 | 5/1988 | Matsuoka et al. | 439/70 OR |
| 4,760,335 | 7/1988 | Lindberg | 324/158 |
| 4,818,238 | 4/1989 | Borg | 439/42 |
| 4,843,313 | 6/1989 | Walton | 324/158 |
| 5,007,844 | 4/1991 | Mason et al. | 439/68 OR |

Primary Examiner—Khiem Nguyen
Assistant Examiner—Daniel Wittels
Attorney, Agent, or Firm—Joseph Stecewycz

[57] ABSTRACT

An electrical socket is disclosed for interfacing between a printed circuit board having contact pads and an electronic module having external leads, such as an integrated circuit. The electrical socket includes a base frame, containing an opening generally conforming to the body shape and size of the electronic module, and a plurality of spaced, parallel conductive members, such as electrical wires, arrayed on a resilient strip coextensive with at least part of the surface of the opening. Each conductive member includes both a lead portion in adjacent parallel relationship with one of the electronic module external leads and a contact portion in electrical engagement with a contact pad, and may also include a retaining portion for securing the conductive member to the resilient strip. The electrical socket may include a cover, with thermal vent holes, to secure the electronic module within the base frame opening.

16 Claims, 6 Drawing Sheets

ELECTRICAL SOCKET FOR HIGH-FREQUENCY APPLICATIONS

BACKGROUND OF THE INVENTION

1. Field of the Invention

The present invention relates to electrical sockets, and more particularly, is directed to an electrical socket suitable for interfacing between a printed circuit board and an electronic module, such as an integrated circuit, particularly for applications in which high-frequency signals and fast switching times are encountered.

2. Description of the Prior Art

Electrical sockets are commonplace in the electronics industry. They can be used for the temporary emplacement of an integrated circuit (IC), or other electronic module having multiple electrical leads, onto an electronic printed circuit (PC) board, or other electrical circuit. By utilizing an electrical socket, procedures such as electrical testing can be performed without the need for soldering or otherwise fixing the electronic module within the circuit. Other procedures for which the use of an electrical socket is advantageous include electrical component calibration, "burning in" active devices, and programming firmware.

In such applications, it is highly desirable that the electrical socket used be essentially "transparent" to the flow of current so that electrical signals and power transmission remain unaffected after passing through the conductive paths provided by the electrical socket. Ideally, neither the characteristics of the electronic module nor the operation of the electrical circuit should be affected by the use of a properly designed electrical socket. An electrical socket which meets the above criteria will, among other things, exhibit low electrical impedance and incorporate conductor geometry with short electrical path lengths. Otherwise, if the electrical impedance is not low, the quality of signal waveforms will deteriorate upon passing through the electrical socket. Generally, rise and fall times increase and "ringing" appears in the signal as it leaves the electrical socket. Moreover, unless conductive path lengths are negligible, signal timing problems result.

Contributing to an increased impedance in high-frequency applications is the "skin effect" phenomenon. As is well-known in the art, direct current flowing in a conductor is normally uniformly distributed throughout the cross section of the conductor. However, this does not hold for signals with alternating current (AC) characteristics. Because the effect of electrical impedance is greater near the center of a conductor than at the surface, AC signals have a tendency to concentrate near the surface of the conductor with the result that the conductor appears to the AC current to have a reduced cross-sectional area. As the effective cross section of the conductor is decreased by this effect, the resistance to AC becomes greater than the resistance to direct current. Although this problem of increased AC resistance is well-recognized in the relevant art, conventional electrical socket designs do not appear to have effectively dealt with this problem.

Timing problems may arise when an electronics module is emplaced into an electrical circuit by means of an electrical socket instead of being fixed directly into the circuit itself. Such a configuration has the effect of increasing the electrical path length for each signal passing through the conductors of the socket. These additional path lengths are usually negligible for low-frequency application, but are not negligible for circuits containing high frequency signals.

Most commercially-available electrical socket designs are acceptable for low-performance applications. However, for more demanding testing incorporating faster switching times and higher signal frequencies, the inadequacy of these electrical sockets is readily apparent.

In addition to above issues related to the operation of the electronic module itself, the cost of fabricating the electrical socket itself is also a factor to be considered. As is well known in the art, an electrical socket is often custom made for a particular electronic module geometry and this usually requires the use of a separate socket for each module having a different lead configuration. Any change in the configuration of an electronic module usually requires that a different electrical socket be provided. Because electrical sockets are expensive to fabricate, each such reconfiguration incurs an additional, and undesirable, expense. Further, because of the exceptional lead time required to fabricate a custom-made electrical socket, scheduling delays result, along with their associated costs.

Typically, a design engineer or an applications technician has had a limited number of commercially-available electrical sockets from which to choose, most of which do not address the needs of the high-performance arena. To circumvent this limitation, a user often physically modifies a commercial electrical socket so as to improve its performance characteristic for a particular application. Such custom-made alterations and modifications are tedious and difficult and, once made, the modified electrical socket has limited usefulness. As the number of required components is increased for advanced applications such as complex test procedures, the number of custom-made electrical sockets required for conducting these procedures increases accordingly. The expense of providing electrical hardware and fixtures for these advanced applications grows as well. Clearly, this expense could be reduced if each additional electronic module configuration did not require a unique electrical socket. If an electrical sockets could be readily adapted for use with more than one configuration of electronic module, the expense of providing electrical hardware and fixtures could be reduced, or kept to a minimum.

The present state of the art indicates a need for an electrical socket which exhibits low electrical impedance and negligible loss of signal information when used to interface with different electronic module configurations in high-frequency applications.

It is an object of the present invention to provide an electrical socket which does not suffer from the heretofore-mentioned disadvantages and limitations.

It is a further object of the present invention to provide an electrical socket which passes signals having fast switching times without causing deterioration of the signal waveforms.

It is a further object of the present invention to provide an electrical socket having negligible signal path lengths.

It is a further object of the present invention to provide an electrical socket which can be readily adapted to accommodate more than one configuration of electronic module.

SUMMARY OF THE INVENTION

The present invention is characterized by an electrical socket, for interfacing between an electronics module and a PC board, having an adjustable base frame with an opening conforming to the body shape of the electronics module. A linear array of conductive members provided near the surface of the base frame opening interface with each external lead of the electronics module and with corresponding contact pads provided on the surface of the PC board. A resilient strip, generally coextensive with the surface of the base frame opening, serves to retain the array of conductive members in position against the module external leads and the PC board contact pads.

Other objects of the present invention will in part be obvious and will in part appear hereinafter. The invention accordingly comprises the apparatuses, processes and products, together with their parts, steps, elements and interrelationships, that are exemplified in the following disclosure, the scope of which will be indicated in the appended claims.

BRIEF DESCRIPTION OF THE DRAWINGS

A fuller understanding of the nature and objects of the present invention will become apparent upon consideration of the following detailed description taken in connection with the accompanying drawings, wherein.

DETAILED DESCRIPTION OF THE INVENTION

Figure 1:
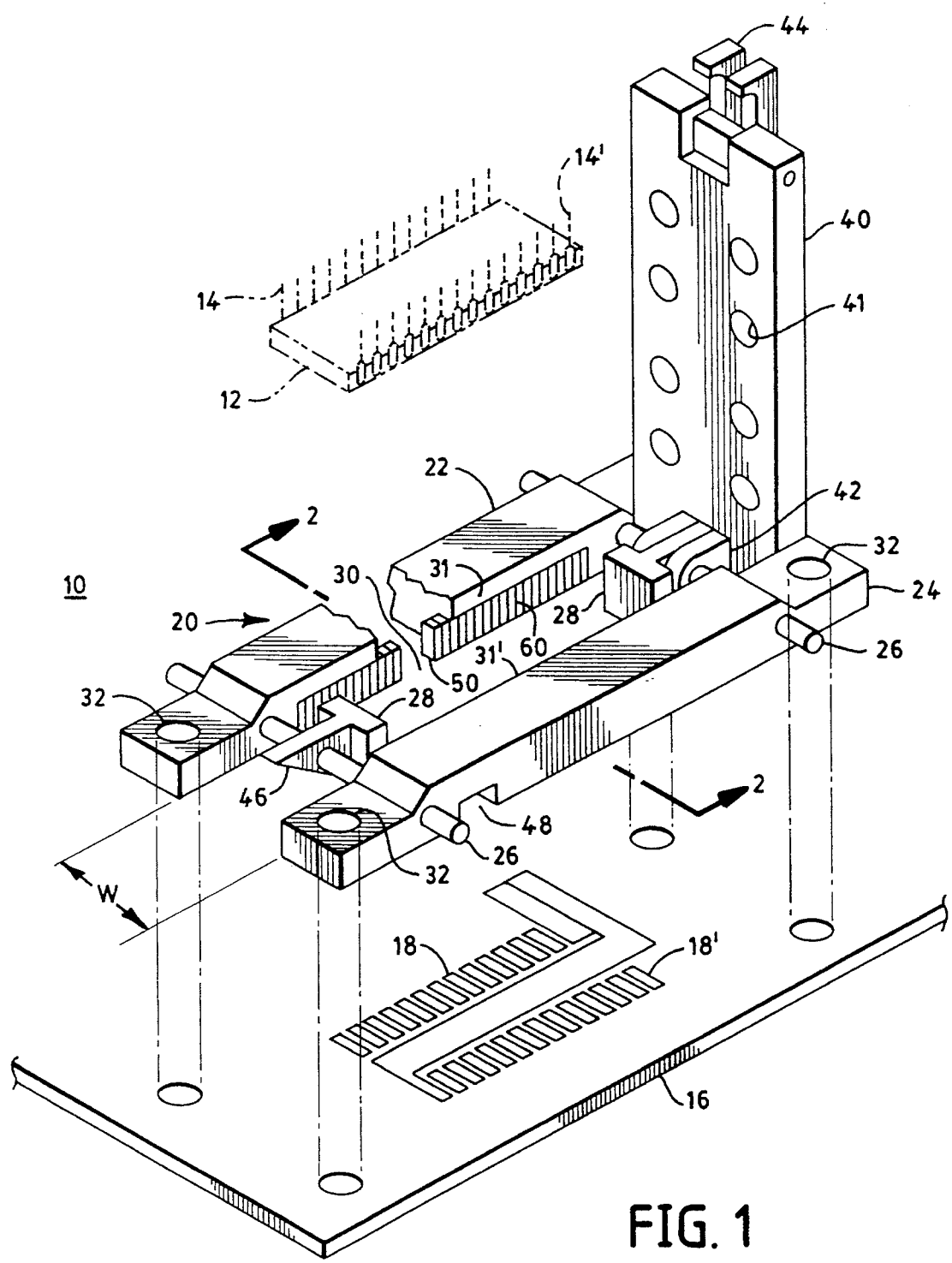
FIG. 1 is a perspective view of one embodiment of an electrical socket according to the present invention.

Referring now to the drawings, particularly FIG. 1, there is shown an electrical socket 10 illustrative of one embodiment of the invention. Electrical socket 10 is configured to electrically and physically interface between an electronic module 12 (not claimed), here shown in a dual in-line package (DIP) configuration, and a PC board 16 (not claimed). In a typical application, electrical socket 10 physically interfaces with a surface portion of PC board 16 upon which are provided a group of contact pads 18. Each contact pad 18 is the terminus of a conductive path leading from a selected point in the electrical circuit on PC board 16. Specific contact pads 18 are designated to provide either electrical power or a signal waveform for the operation or testing of electronic module 12. Similarly, response signals produced by electronic module 12 are returned to the circuit by way of other contact pads 18 designated for those functions.

Electrical socket 10 includes a base frame 20, for electrically and physically interfacing with electronic module 12, and may include a cover 40 to secure the electronic module 12 within base frame 20. An opening 30 extends through base frame 20 and generally conforms to the shape of electronic module 12. In the embodiment shown, opening 30 is rectangular to conform to the DIP module which has a rectangular body with external leads 14 and 14' along two of the four body sides. In a typical application, electronic module 12 is placed into opening 30 with external leads 14 adjacent to inner surface 31 of opening 30 and with external leads 14' adjacent to inner surface 31'. The leads 14 and 14' of electronic module 12 extend away from PC board 16, in a "dead-bug" orientation and are positioned against a resilient strip 50 provided at inner surfaces 31 and 31' of opening 30. A linear array of parallel conductive members 60 is disposed along the surface of resilient strip 50. The width, or vertical dimension, of resilient strip 50 is sufficiently large so as to (i) engage some portion of each lead 14 and 14' of electronic module 12, and (ii) make physical contact with the group of contact pads on PC board 16. Resilient strip 50 may extend the entire perimeter of opening 30 in a configuration intended primarily to engage all the external leads of electronics module 12 without causing interference with the insertion or removal of electronic module 12. For an application in which the electronics module included "bumpers" at its corners, resilient strip 50 will not extend into the corresponding corners of opening 30.

A hinge 42 allows cover 40 to be swung outward from opening 30 to provide for the emplacement or removal of electronic module 12. A clasp 44 on cover 40 engages with a detent 46 on base frame 20 to secure cover 40 when it is closed over opening 30. Cover holes 41 may be provided in cover 40 to improve convective heat transfer from electronic module 12 during prolonged periods of operation such as testing.

Base frame 20 is comprised of longitudinal members 22 and 24 and transverse structural members, here shown as pins 26. Both pins 26 are frictionally engaged within opposed ends of longitudinal members 22 and 24. Fastening devices such as screws, bolts, and nuts can be used in place of pins 26 if desired. Whether pins or fastening devices are used, longitudinal members 22 and 24 are maintained in parallel alignment, but can be moved closer together or further apart. This feature allows the width of opening 30, denoted by W, to be adjusted to accommodate electronic modules of different dimensions. Width W is precisely maintained by the emplacement of a spacer 28 of suitable length over each pin 26 and between longitudinal members 22 and 24. Spacers 28 can be replaced by spacers 28' of a different length (not shown) to change base opening 30 dimension W.

Longitudinal member 24 includes a recess 48 sized so as to accommodate an external component such as a bypass capacitor (not shown) which is attached to contact pads 18 if needed for a particular test procedure. Likewise, longitudinal member 22 may also include a recess 48 to accommodate an external component if desired. In a conventional test configuration, the bypass capacitor is usually mounted on the undersurface of PC board 16. It can be appreciated by one skilled in the art that such a conventional bypass capacitor emplacement results in a significant path length between an electronic module emplaced within an electrical socket on one side of a PC board, and the bypass capacitor mounted on the opposite side of the board. By providing the recess 48, the bypass capacitor can be mounted on the same side of a PC board as the contact pads 18 without encountering physical interference with electrical socket 10.

Base holes 32 may also be provided near the ends of longitudinal members 22 and 24. Mechanical fasteners (not shown) can be inserted through base holes 32 to secure electrical socket 10 to PC board 16. This attachment of base frame 20 to PC board 16 insures that the electrical interface between electronic module 12 and PC board 16 is maintained. Although attachment of base frame 20 is usually accomplished by means of mechanical fasteners, an adhesive can be used as an alternative method of attachment.

Figure 2A:
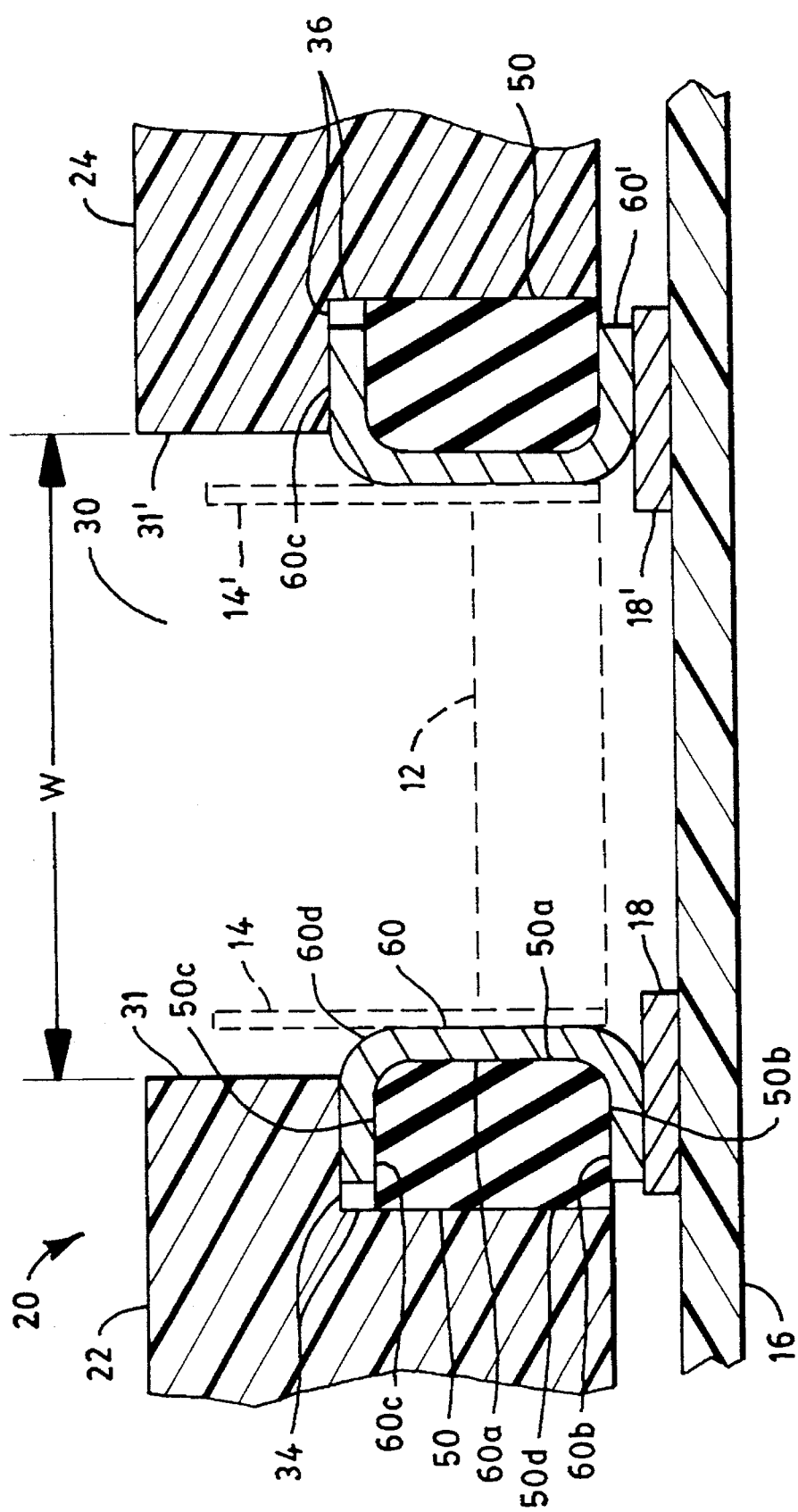
FIG. 2A is a sectional view of the electrical socket of FIG. 1, taken along line 2—2, showing emplacement of an electronic module having a dual-in-line configuration.

FIG. 2A shows frame base 20 in cross section with electronic module 12 (in phantom) placed within opening 30 and positioned above contact pads 18 and 18'. In a preferred embodiment, inner surface 31 has a step configuration for the emplacement of resilient strip 50 within a groove 34 in longitudinal member 22. Groove 34 serves to engage a retaining surface 50c of resilient strip 50 and force resilient strip 50 against PC board 16. For a more positive retention, the resilient strip 50 can be additionally secured to longitudinal member 22 by frictional fit or by a suitable adhesive at a mounting surface 50d. Resilient strip 50 is similarly retained within a groove 36 in longitudinal member 24. Preferably, the width, W, of opening 30 is adjusted to insure that electronic module 12 is frictionally retained in base frame 20 by means of resilient strip 50. Resilient strip 50 may be fabricated from an elastomeric material such as a non-conductive, low-durometer silicone rubber.

The parallel conductive members 60 disposed along the surface of resilient strip 50 serve to provide the electrical conductive paths between the leads 14 of electronic module 12 and PC board 16 by way of contact pads 18. Similarly, on the opposite surface 31' of opening 30, conductive member 60' serves to provide a conductive path between lead 14' and contact pad 18'. Conductive members 60 and 60' may be fabricated from any suitable flat or round electrical conductor such as copper or gold wire. Each conductive member 60 is comprised of a lead portion 60a engaging mating surface 50a of resilient strip 50 and a contact portion 60b engaging contact surface 50b of resilient strip 50. The configuration is similar for conductive member 60' engaging resilient strip 50 and the description for conductive member 60 which follows also applies to conductive member 60'. In a typical application, lead portion 60a is disposed in a parallel relationship proximate external leads 14 of electronic module 12 and contact portion 60b is disposed against contact pads 18. In a preferred embodiment, conductive member 60 will also include retaining portion 60c engaging retaining surface 50c of resilient strip 50 as means to physically secure conductive member 60 to resilient strip 50.

It can be appreciated by those skilled in the art that the number of conductive members 60 arrayed along surface 50a of resilient member 50 can be significantly greater than the number of external leads 14 engaging the same portion of resilient strip 50. That is, the spacing interval for the conductive members 60 will be equal to or less than the spacing interval for the external leads 14. The width of the conductive members 60 will generally be less than the width of the external leads 14. In this way, multiple conductive paths can be provided between each external lead 14 and a corresponding contact pad 18. By using multiple conductive paths to carry signals having fast switching times, problems resulting from the skin effect discussed above are moderated or eliminated.

In one application of the inventive concept, a commercial product having flat (or round) conductive ribbons on an elastomer material, available as Zebra® series 7000 Low Resistance Connectors from Fujipoly in Cranford, N.J., was used. The resilient strip had a width of 0.100 inch with flat conductive members of width 0.005 inch spaced 0.015 inch center-to-center. When used with an electronic module having external leads of width 0.017 inch with a standoff width of 0.045 inch spaced 0.100 inch center-to-center, this configuration of resilient strip provided three to five conductive members for each external lead at the standoff section.

As noted above, each conductive member 60 (or 60') serves to provide an electrical path, or interconnection, between an adjacent external lead 14 (or 14') and an adjacent contact pad 18 (or 18') on PC board 16. The electrical interconnection between a conductive member 60 and a signal on an adjacent external lead 14 is achieved both by conduction of the signal where physical contact is made, and by induction where both external lead 14 and conductive member 60 lie in the electrical field produced by the particular signal.

Various electronic module packaging configurations having in-line external leads for either through-hole mounting or surface mounting can be accommodated by the electrical socket of FIG. 1. External leads designed for through-hole mounting are generally straight, and perpendicular to the body of the electronic module. FIG. 2A shows such an external lead configuration on a DIP electronic module in a dead-bug orientation. For certain dual-side external lead configurations, such as the DIP, the ceramic DIP (CERDIP), and the shrink DIP (SDIP), the electronic module can be placed into electrical socket 10 in either a dead-bug or a "live-bug" orientation. However, a dead-bug orientation allows the body of the electronic module to be positioned more closely to the PC board 16 than can be achieved with a live-bug orientation. Close positioning minimizes the additional path length introduced by the electrical socket as explained in greater detail below.

Figure 2C:
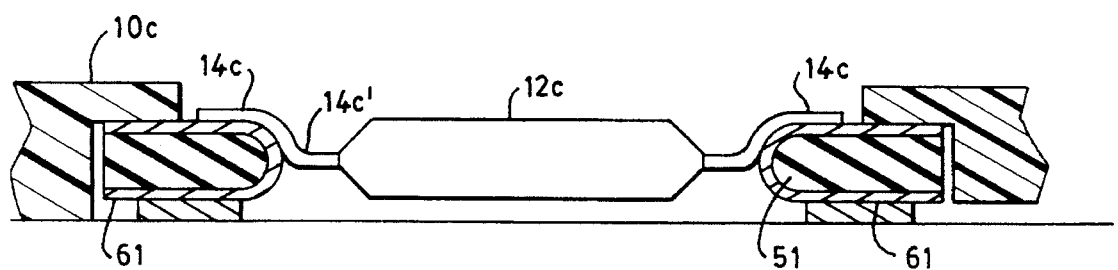
FIG. 2C is a sectional view of the electrical socket of FIG. 1, showing emplacement of an electronic module having gull-wing leads.

External leads designed for surface mounting are generally curved or bent along their length so as to allow a portion of the lead to make physical contact with the surface of a PC board. One example of a surface-mount external lead is shown in FIG. 2B. Electronic module 12b is configured as an SOJ with external leads 14b having the tips curved inward towards the bottom of the electronic module body. This type of external lead, commonly denoted as a J-lead, does not affect the "footprint" of the electronic module and thus allows a live-bug orientation in the electrical socket 10b. However, the preferred orientation is the dead-bug position by which a short path length can be maintained for electrical signals.

Certain other external lead configurations, which enlarge the footprint of the electronic module 12, allow only the dead-bug orientation. FIG. 2C shows an electronic module 12c in a thin small outline package (TSOP) configuration, with gull-wing external leads. It can be seen that, because of the outward placement of the external leads, electronic module 12c interfaces with electrical socket 10c only in a dead-bug orientation. For these lead configurations, resilient strip 51 and conductive members 61 have the modified, extended cross section shown. An extended cross section provides for electrical contact at an upper portion 14c' of gull-wing external lead 14c, advantageously close to the body of electronic module 12c. This, in turn, achieves a short electrical path length between contact pad 18 and the gull-wing external lead on electronic module 12c.

Figure 3A:
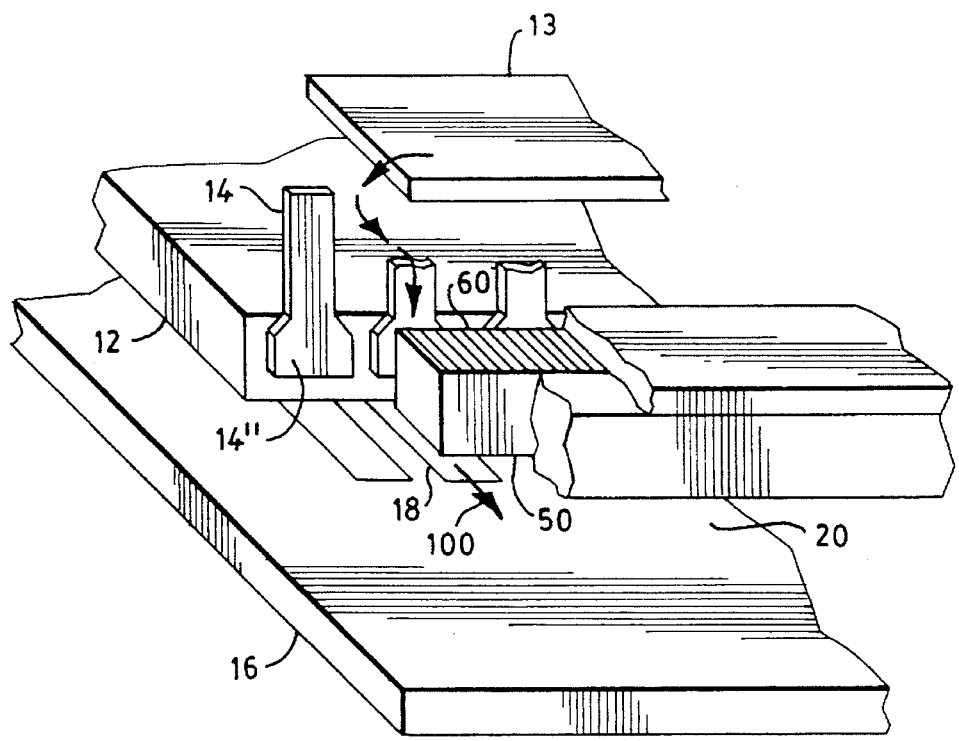
FIG. 3A is a perspective view showing the path taken by a signal passing from an electronic module, through the electrical socket of FIG. 1, and into a PC board.

The improved performance achieved by the inventive device can be explained in more detail with reference to FIG. 3A in which electronic module 12 is shown in position against resilient strip 50. External lead 14 has a wide portion, commonly denoted as a standoff section 14". Since standoff section 14" is wide, contact can be made with a greater number of conductive members 60 at the standoff section 14" than on the rest of the external lead 14. Consequently, when a greater number of parallel conductive members 60 are used for the conduction of a signal, the overall inductance is reduced and the quality of the signal passed by the electrical socket 12 is not degraded. By emplacing electronic module 12 in a dead-bug orientation, as explained above, a maximum number of conductive members 60 are positioned to contact standoff sections 14" of the external leads 14. By means of the increased number of conductive members 60 used for each external lead, the skin effect, discussed above, is moderated or eliminated.

Moreover, the inventive device achieves a short path length 100 between the active circuit 13 on electronic module 12 and contact pad 18 on PC board 16. It can be appreciated that the increase in path length resulting from use of electrical socket 20 is comprised of only a segment of lead portion 60a and a segment of contact portion 60b of conductive member 60, as shown in FIG. 2A. This increased path length, which is small in comparison to the dimensions of active circuit 13, is negligible for most high-frequency applications.

Figure 3B:
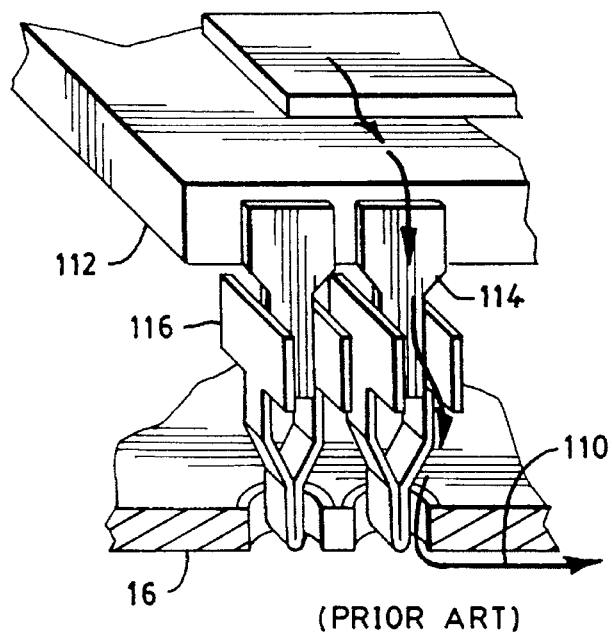
FIG. 3B is a perspective view showing the path taken by a signal passing from an electronic module, through a prior art electrical socket, and into a PC board.

In comparison, the increase in path length for a prior art socket 112 can be substantial in comparison to the dimensions of an active circuit, as shown in FIG. 3B. In this configuration, a signal travels along a path length 110 which includes the entire length of an external lead 114, and then travels through essentially the entire length of a socket contact 116 before reaching the PC board 16 itself. Moreover, because socket contact 116 makes electrical contact with the narrow edges of external lead 114 instead of with the wide faces of the lead, the contact resistance at this interface remains high.

Figure 4:
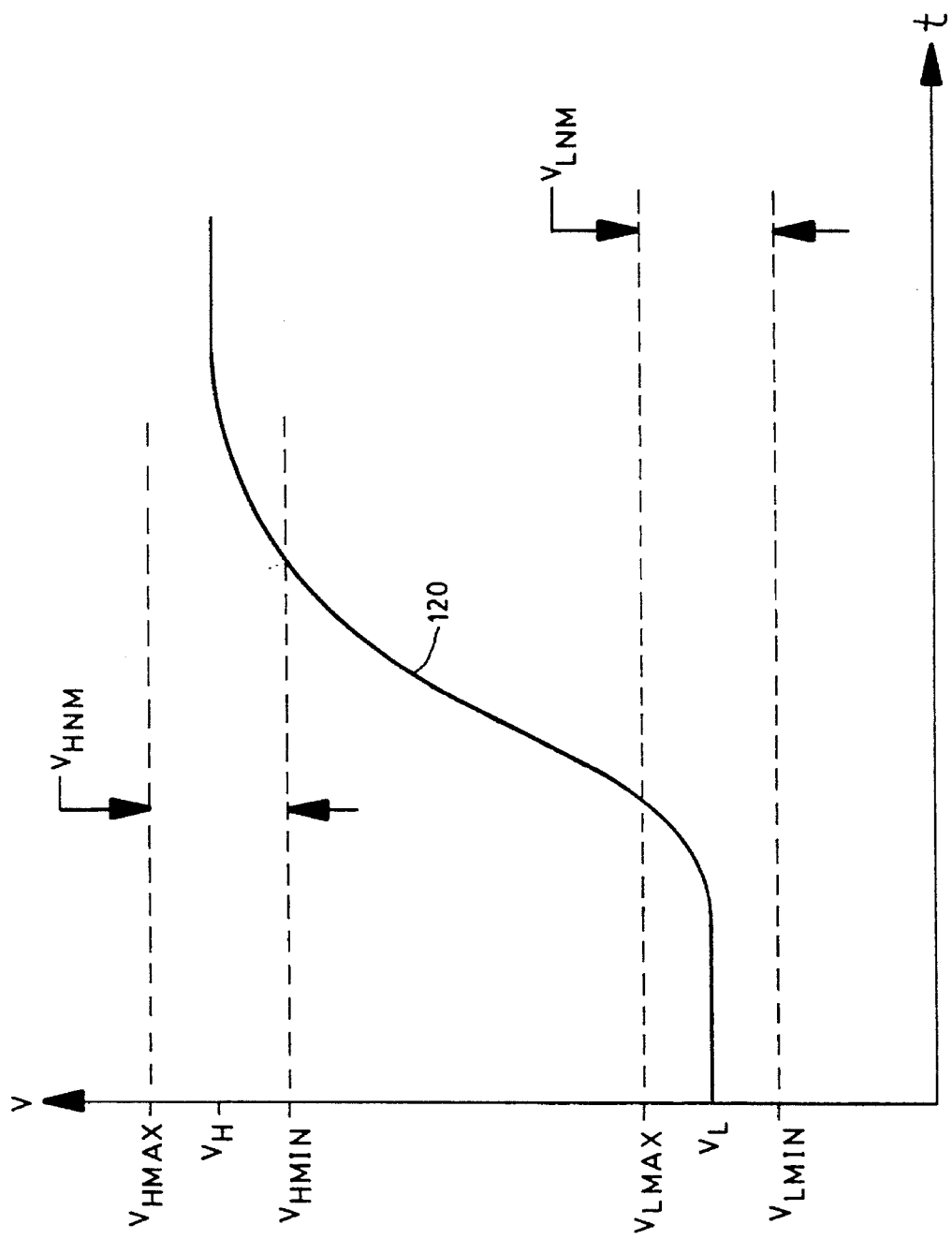
FIG. 4 is a graph of a voltage signal illustrating the derivation of noise margin figures.

The features of the electrical socket disclosed herein can be further distinguished over prior-art devices by reference to the noise margin values measured for the disclosed device. A voltage signal 120 is shown in FIG. 4 switching from a LOW state ($V_L$) to a HIGH state ($V_H$). Any output/input signal voltage smaller than $V_{LMAX}$ is considered to be a logic level "zero" and any output/input signal voltage greater than $V_{HMIN}$ is considered to be a logic level "one." Any signal falling in between the $V_{LMAX}$ to $V_{HMIN}$ range is considered to be an indeterminate signal. Similarly, any input signal voltage smaller than $V_{LMAX}$ and larger than $V_{LMIN}$ is considered to be a logic level LOW. Any input signal voltage larger than $V_{HMIN}$ and smaller than $V_{HMAX}$ is considered to be a logic level HIGH. The high-state noise margin $V_{HNM}$ is defined to be the difference between $V_{HMIN}$ and $V_{HMAX}$. The low-state noise margin $V_{LNM}$ is defined to be the difference between $V_{LMIN}$ and $V_{LMAX}$.

Noise margin figures, obtained for the inventive device by using a 100 MHz, 50% duty cycle, 3 volt peak-to-peak clock pulse, showed a 49% improvement over the noise margin figures for prior-art devices.

Figure 5:
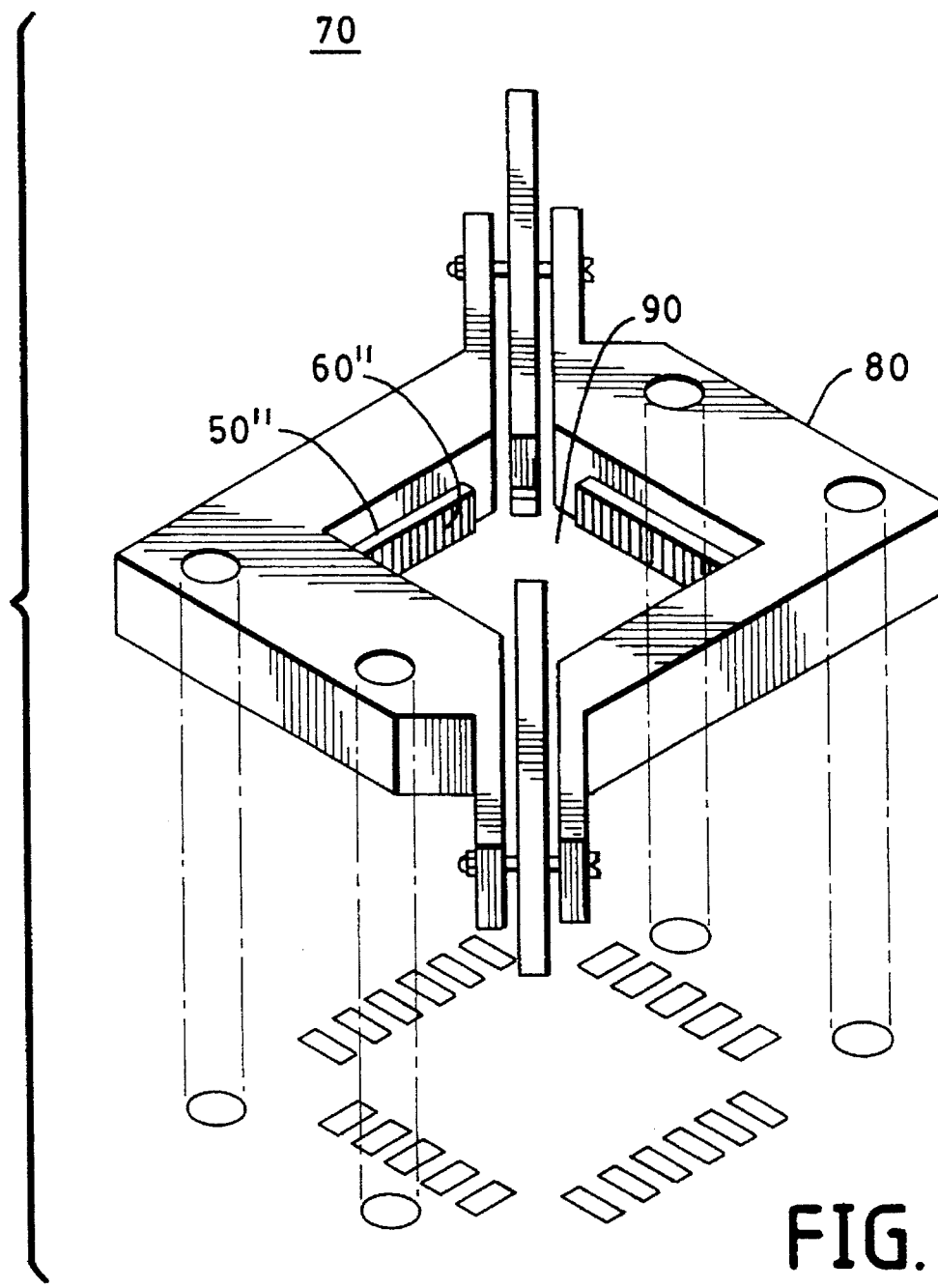
FIG. 5 is a perspective view of an alternate embodiment of an electrical socket according to the present invention.

An alternative embodiment of the disclosed invention is an electrical socket 70 shown in FIG. 5. Electrical socket 70 is comprised of a base frame 80 having a four-sided opening 90 generally conforming to the shape of an electronic module (not shown) having external leads along all four sides of the module body. Resilient strip 50" may extend the entire perimeter of opening 90 in a configuration intended primarily to engage all the external leads of the module without causing interference with the insertion or removal of the module. For an application in which the module includes bumpers at its corners, resilient strip does not extend into the corresponding corners of opening 90. Conductive members 60" are disposed on resilient strip 50" in a configuration similar to that described above for conductive members 60.

Figure 2D:
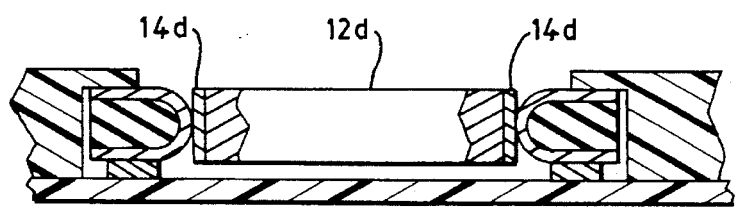
FIG. 2D is a sectional view of the electrical socket of FIG. 5, showing emplacement of a leadless chip carrier electronic module.
Figure 2B:
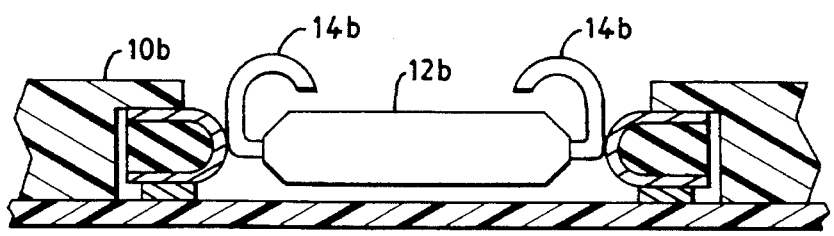
FIG. 2B is a sectional view of the electrical socket of FIG. 1, showing emplacement of an electronic module having J-leads.

The external lead configuration for the module emplaced in electrical socket 70 may be similar to the external lead configurations shown in FIGS. 2A through 2C above, or the configuration may be that of a "leadless" chip carrier (LCC) as shown in FIG. 2D. An electronic module 12d with this lead configuration can be positioned in either a body cavity-up or cavity-down orientation with negligible effect on the resulting path length between contact pad 18 and external lead 14d.

Having thus described the inventive device with reference to the several embodiments, it will be understood that other modifications and variations may occur to those skilled in the art without departing from the spirit and the scope of the invention. Accordingly, the various changes in form and in detail which may be made are intended to fall within the scope of the appended claims.

What is claimed is:

1. An electrical socket, suitable for electrically interconnecting an electronic module having external lea& with a printed circuit board having contact pads, said electrical socket comprising:

a base frame, having an upper surface, a lower surface, and an opening therethrough generally conforming to the body shape and size of the electronic module, said opening defining an inner surface extending between said upper surface and said lower surface;

at least one resilient strip, coextensive with at least a portion of said inner surface, said resilient strip comprising a mounting surface for engaging said base frame inner surface, a mating surface for engaging the electronic module external leads, a contact surface essentially coplanar with said base frame lower surface, and a retaining surface; and, a plurality of conductive members, each comprising a lead portion and a contact portion, said conductive members strayed upon said resilient strip in generally parallel disposition to one another, each said conductive member configured such that said lead portion physically engages said resilient strip mating surface and said contact portion physically engages said resilient strip contact surface; whereby said conductive member contact portion electrically engages the contact pads when said base frame lower surface is positioned against the printed circuit board, and placement of the electronic module into said base frame opening positions each electronic module external lead proximate said resilient strip mating surface and places each electronic module external lead into adjacent parallel relationship with at least one said conductive member lead portion to establish electrically conductive paths between the electronic module external leads and the printed circuit board via the contact pads.

2. An electrical socket as in claim 1 wherein said base frame further comprises two longitudinal members and two transverse members, said longitudinal members being frictionally retained in opposed relationship by means of said two transverse members, whereby said base frame opening can be dimensionally changed so as to accommodate more than one electronic module body shape and size.

3. An electrical socket as in claim 2 further comprising a cover, said cover having a first end and a second end, said cover further being pivotally secured at said first end to one said transverse member, whereby said cover is rotatable about said first end to engagingly retain the electronic module within said base frame opening.

4. An electrical socket as in claim 3 wherein said socket base further comprises a detent means, whereby said cover second end can be secured to the other said transverse member by means of said detent means.

5. An electrical socket as in claim 1 wherein said base frame inner surface includes a step configuration, whereby said inner surface engages said resilient strip retaining surface to force said resilient strip against the PC board.

6. An electrical socket as in claim 1 wherein said base frame further includes at least two base holes extending through said base frame, between said upper surface and said lower surface, whereby mechanical fasteners can be inserted through said base holes to secure said electrical socket to the printed circuit board.

7. An electrical socket as in claim 1 wherein said resilient strip is comprised of an elastomeric material.

8. An electrical socket as in claim 7 wherein said resilient strip is comprised of a non-conductive, low durometer silicone rubber.

9. An electrical socket as in claim 1 wherein each said conductive member further comprises a retaining portion to engage said resilient strip upper surface, whereby said conductive members are physically secured to said resilient strip.

10. An electrical socket as in claim 1 wherein said conductive member is comprised of electrical wire.

11. An electrical socket as in claim 10 wherein said conductive member is not greater than 0.017 inch in width.

12. An electrical socket, suitable for electrically interconnecting an electronic module having external leads with a printed circuit board having contact pads, said electrical socket comprising:

a base frame, having an upper surface, a lower surface, and an opening therethrough generally conforming to the body shape and size of the electronic module, said opening defining an inner surface extending between said upper surface and said lower surface;

at least one resilient strip comprised of an elastomeric material, coextensive with at least a portion of said inner surface, said resilient strip comprising a mounting surface for engaging said base frame inner surface, a mating surface for engaging the electronic module external leads, a contact surface essentially coplanar with said base frame lower surface, and a retaining surface; and, a plurality of electrical wires, each comprising a lead portion, a contact portion, and a retaining portion, said electrical wires arrayed upon said resilient strip in generally parallel disposition to one another, each said electrical wire configured to physically engage said resilient strip mating surface, said resilient strip contact surface, and said resilient strip retaining surface; whereby said electrical wire contact portion electrically engages the contact pads when said base frame lower surface is positioned against the printed circuit board, and placement of the electronic module into said base frame opening positions each electronic module external lead proximate said resilient strip mating surface and places each electronic module external lead into adjacent parallel relationship with at least one said electrical wire lead portion to establish electrically conductive paths between the electronic module external leads and the printed circuit board via the contact pads.

13. An electrical socket as in claim 12 wherein said resilient strip is comprised of a non-conductive, low durometer silicone rubber.

14. An electrical socket as in claim 12 wherein said electrical wires are no greater than 0.017 inch in width.

15. An electrical socket as in claim 12 wherein said electrical wires are spaced at intervals of no more than 0.100 inch.

16. An electrical socket as in claim 12 further comprising adhesive means for securing said resilient strip to said base frame.

* * * * *